United States Patent
Cao et al.

(10) Patent No.: US 7,911,365 B2
(45) Date of Patent: *Mar. 22, 2011

(54) APPARATUS AND METHOD FOR ANALOG-TO-DIGITAL CONVERTER CALIBRATION

(75) Inventors: Jun Cao, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/656,055

(22) Filed: Jan. 14, 2010

(65) Prior Publication Data

US 2010/0117876 A1 May 13, 2010

Related U.S. Application Data

(63) Continuation of application No. 12/000,757, filed on Dec. 17, 2007, now Pat. No. 7,688,237.

(60) Provisional application No. 60/876,154, filed on Dec. 21, 2006.

(51) Int. Cl.
*H03M 1/10* (2006.01)

(52) U.S. Cl. .................................. 341/120; 341/155

(58) Field of Classification Search .................. 341/118, 341/120, 155, 158, 159
See application file for complete search history.

(56) References Cited

U.S. PATENT DOCUMENTS

| | | | |
|---|---|---|---|
| 5,345,235 A | 9/1994 | Babcock | |
| 5,592,167 A * | 1/1997 | Caruso et al. | 341/159 |
| 5,675,339 A * | 10/1997 | Andren et al. | 341/155 |
| 5,696,508 A | 12/1997 | Gross et al. | |
| 6,504,863 B1 | 1/2003 | Hellmark | |
| 6,734,817 B2 * | 5/2004 | Naka et al. | 341/155 |
| 6,993,291 B2 * | 1/2006 | Parssinen et al. | 455/67.11 |
| 7,075,465 B2 | 7/2006 | Jonsson et al. | |
| 7,193,553 B1 * | 3/2007 | Bahai | 341/161 |
| 7,212,144 B1 | 5/2007 | Sutardja | |
| 2004/0219959 A1 * | 11/2004 | Khayrallah et al. | 455/575.7 |
| 2007/0001889 A1 * | 1/2007 | Garlapati et al. | 341/155 |
| 2007/0263673 A1 * | 11/2007 | Agazzi et al. | 370/516 |
| 2008/0062032 A1 | 3/2008 | Park et al. | |
| 2008/0150772 A1 | 6/2008 | Cao et al. | |
| 2010/0226421 A1 * | 9/2010 | Kibune | 375/229 |

* cited by examiner

*Primary Examiner* — Howard Williams
(74) *Attorney, Agent, or Firm* — Sterne, Kessler, Goldstein & Fox PLLC

(57) ABSTRACT

An analog-to-digital converter (ADC) is provided. The ADC includes a reference voltage generator configured to generate reference voltages, an analog to digital converter core configured to receive an input signal and the reference voltages and to generate a digital signal representative of the input signal, the digital signal having a number of bits, and a controller configured to determine a quality of the input signal, and, based on a quality of the input signal, to control the number of bits of the digital signal and values of the reference voltages.

17 Claims, 14 Drawing Sheets

APPARATUS AND METHOD FOR ANALOG-TO-DIGITAL CONVERTER CALIBRATION

CROSS-REFERENCE TO RELATED APPLICATIONS

This application is a continuation of application Ser. No. 12/000,757, filed Dec. 17, 2007, now U.S. Pat. No. 7,688,237, issued Mar. 30, 2010, which claims the benefit of U.S. Provisional Appl. No. 60/876,154, filed Dec. 21, 2006, both of which are incorporated by reference herein in their entireties.

BACKGROUND

1. Field

The invention relates to analog-to-digital conversion. In particular, the invention relates to the calibration of analog-to-digital converters (ADC) and programmable precision ADCs.

2. Background

Analog-to-digital converters (ADC) are electrical circuits that convert analog voltages signals to digital voltage signals. Many types of ADCs are made up of numerous data paths consisting of interconnected transistors. Inevitable mismatches between transistors in each of these data paths often hamper performance of the ADC by leading to an offset voltage that can cause errors in the conversion. To reduce this mismatch offset voltage, the total area of the transistors in the data path is often increased, since the threshold voltage (Vt) mismatch for a MOS transistor reduces proportionally to the square root of the gate area of the transistor. As the size of the transistors increases, however, the speed of the ADC is severely degraded. This speed degradation may limit the types of applications the ADC may be used in. Or to compensate the speed degradation, ADC has to consume more power to increase the bandwidth. Thus, what is a needed is a way of reducing the offset voltage in ADCs without having to increase the sizes of the transistors that make up the ADC.

BRIEF SUMMARY

In an embodiment, an analog-to-digital converter (ADC) is provided. The ADC includes a reference voltage generator configured to generate reference voltages, an analog to digital converter core configured to receive an input signal and the reference voltages and to generate a digital signal representative of the input signal, the digital signal having a number of bits, and a controller configured to determine a quality of the input signal, and, based on a quality of the input signal, to control the number of bits of the digital signal and values of the reference voltages.

In another embodiment, an analog to digital converter (ADC) includes an analog to digital converter core configured to receive an input signal and reference voltages and to generate a digital signal representative of the input signal and a controller configured to transition the analog to digital converter core from a first state to a second state based on a quality of the input signal. In the first state, the analog to digital converter core has a first number of elements active and, in the second state, the analog to digital converter core has a second number of elements active. The first number and the second number are different.

In still another embodiment, an analog-to-digital converter (ADC) includes means for generating reference voltages, an analog to digital converter core configured to receive an input signal and the reference voltages and to generate a digital signal representative of an input signal, the digital signal having a number of bits, and means for determining a quality of the input signal, and controlling, based on a quality of the input signal, the number of bits of the digital signal and values of the reference voltages.

In another embodiment, a method of analog to digital conversion is provided. The method includes determining a quality of an input signal, controlling the number of bits based on the determined quality, and controlling values of the reference voltages based on the quality of the input signal. An analog to digital converter core generates a digital signal representative of the input signal using reference voltages. The digital signal has a number of bits.

These and other objects, advantages and features will become readily apparent in view of the following detailed description of the invention. Note that the Brief Summary and Abstract sections may set forth one or more, but not all exemplary embodiments of the present invention as contemplated by the inventor(s).

BRIEF DESCRIPTION OF THE DRAWINGS/FIGURES

Figure 1:
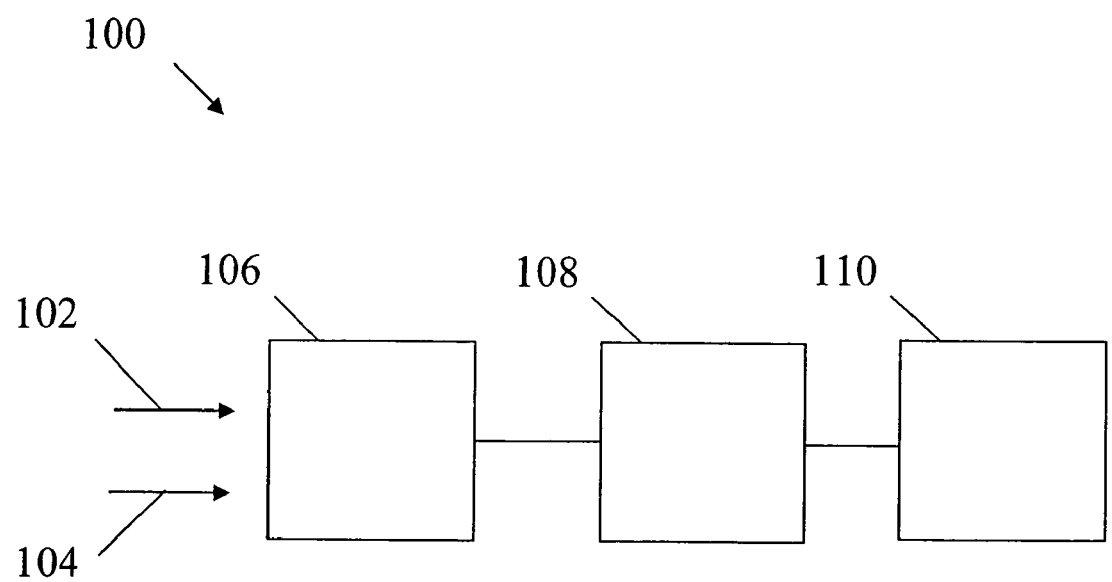
FIG. 1 shows a block diagram of a typical ADC.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Methods, systems, and apparatuses for calibration of analog-to-digital converters (ADC) and programmable precision ADCs are described herein. The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "down," "top," "bottom," "vertical," "horizontal," etc.) used herein are for purposes of illustration only, and that practical implementations of the structures described herein can be spatially arranged in any orientation or manner.

Example Analog-to-Digital Converter Embodiment

Before describing embodiments of the present invention in detail, it is helpful to describe an example analog to digital converter (ADC). FIG. 1 shows a general block diagram of an analog-to-digital converter 100. ADC 100 includes an amplifier block 106, a comparator block 108, and a digital logic block 110. In the embodiment that ADC 100 is a flash ADC, each block may include multiple identical components along parallel data paths. As shown in FIG. 1, amplifier block 106 takes an input signal 102 and a reference signal 104. Reference signal 104 typically includes one or more reference signal levels. These levels are compared to input signal 102 at some point during the ADC process. In the embodiment shown in FIG. 1, amplifier block 106 is a differential amplifier which outputs an amplified version of a difference between reference signal 104 and input signal 102. Those skilled in the relevant art(s) will appreciate that computing a difference between a reference level of reference signal 104 and input signal 102 and comparing the difference to a voltage ground is essentially the same as comparing the reference signal and input signal 102. In alternate embodiments, amplifier block 106 may be a single ended amplifier or common mode amplifier in which either one or both of input signal 102 and reference signal 104 are amplified.

In an alternate embodiment, amplifier block 106 provides a gain substantially close to 1. In such an embodiment, amplifier block 106 serves as a buffer block for input signal 102 and reference signal 104. Amplifier block 106 may work as a buffer in either differential or common mode, as would be understood by persons skilled in the relevant art(s).

An output of amplifier block 106 is electrically connected to comparator block 108. Comparator block 108 compares a form of input signal 102 to each signal level of reference signal 104. Each comparator within comparator block 108 outputs a digital '1' or '−1' if the signals are different, with the sign depending on the sign of the difference between input signal 102 and the reference signal level, and a digital '0' if input signal 102 is substantially similar to the reference signal level.

An output of comparator block 108 is electrically connected to a logic block 110. Logic block 110 converts the output(s) of comparator block 108 to a serial digital stream in the format specific to the application.

ADC 100 may be a flash ADC. In a flash ADC a separate comparator is dedicated to each possible output of ADC 100. Flash ADCs may include a plurality of slices. A slice necessarily includes a comparator, but may also include an amplifier, an interpolator, and/or other components.

As advancements in CMOS technology have lead to smaller gate lengths, supply voltages have also dropped significantly, from tens of volts to about 1 V for today's deep submicron processes. Although the smaller supply voltages have lead to power savings, they have also lead to added difficulty in the design of voltage-referenced high-precision circuits, such as ADCs. As the range of values an ADC can output reduces and the number of bits used to represent an input signal remains constant, the size of the least significant bit (LSB) decreases. The size of the LSB of an ADC refers to the smallest difference at the input corresponding to two adjacent output levels. To allow for the decrease in the size of the LSB, the mismatch offset needs to be reduced by the same proportion as the reduction in the size of the LSB. This may be done by increasing the size of the transistors in the data path. In a first order approximation, the mismatch offset is proportional to the square root of the active area of transistors in the data path. For example, in order to reduce the mismatch offset by 50%, the size of the transistors needs to be increased to 400% of the original size, which can degrade the ADC speed tremendously, especially in high-speed flash ADCs. For high-speed applications, flash-type ADCs are most widely employed, which are composed of identical arrays of comparators to utilize the parallelism. To prevent the degradation of bandwidth, power needs to be added to drive the extra load resulting from the increase in transistor size. As a result, with today's deep sub-micro CMOS technology, conventional flash ADCs are experiencing diminishing benefits in power reduction with the advance of the CMOS processes. In some cases, with the advancement of CMOS processes, the ADCs power consumption is even increased, only to maintain the same precision in the output.

Digital circuitry also benefits from advancements in CMOS processes through increases in speed and reduction in power and area. As a result, signal processing techniques can be applied ADCs to correct for non-ideal conditions without adding much overhead in power or area. By building increasingly complicated digital circuits to compensate for the degradation of the analog circuits working with low supply voltage, the benefits of the advancements in deep-submicron CMOS process can be fully utilized. As a result, devices with rather small size can be employed in the data path of the ADC, which can significantly reduce the area and power consumption of the ADC.

Example Apparatus Embodiments for ADC Calibration

Further details of structural and operational implementations of ADC calibration techniques of the present invention are described in the following sections. These structural and operational implementations are described herein for illustrative purposes, and are not limiting.

Features of each of the embodiments presented below may be incorporated into ADCs independently, or may be combined in any manner with the other features described herein, as would be apparent to persons skilled in the relevant art(s) from the teachings herein.

Figure 2:
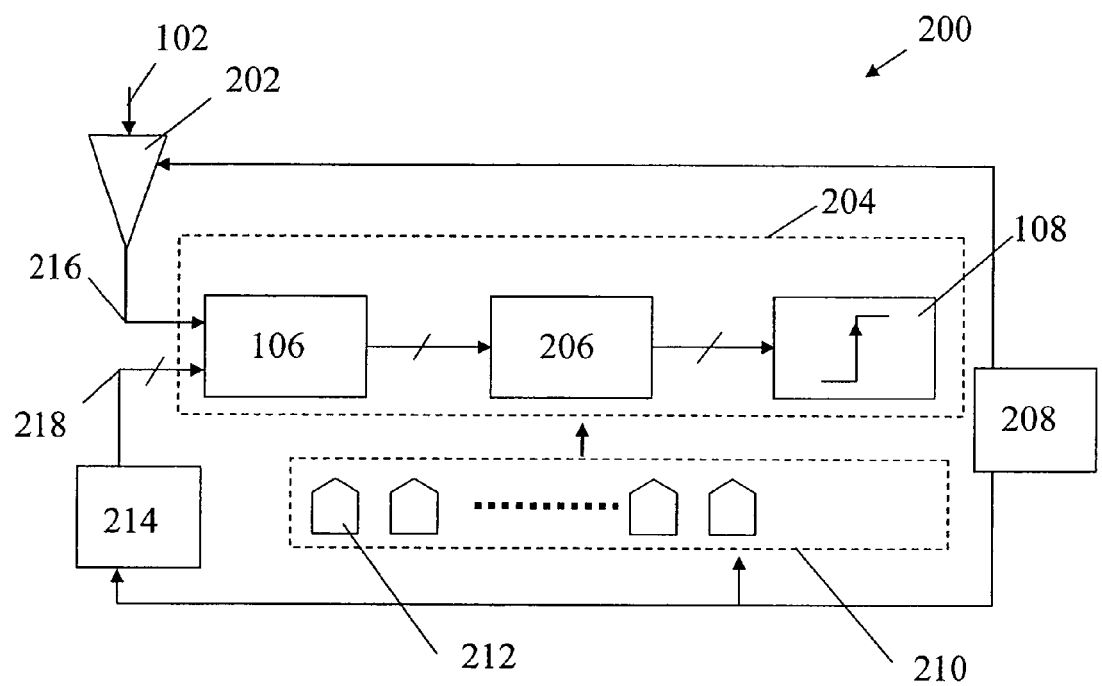
FIG. 2 shows a block diagram of an ADC, according to an embodiment of the present invention.

FIG. 2 shows a block diagram of an ADC 200 according to an embodiment of the present invention. ADC 200 includes an input buffer 202, an ADC core 204, a calibration control 208, a digital to analog converter (DAC) 210, and a reference signal generator 214.

ADC core 204 includes amplifier block 106, an interpolator block 206, and comparator 108. Amplifier block 106 and comparator block 108 operate substantially similar to amplifier block 106 and comparator block 108 as described with reference to FIG. 1. Interpolator block 206 interpolates the output of amplifier 106. An output of the interpolator 106 is electrically connected to comparator block 108. In alternate embodiments, ADC core 204 does not have interpolator block 206.

Input signal 102 is input to input buffer 202. Input buffer 202 outputs a buffered input signal 216. Buffered input signal 216 retains all informational content present in input signal 102.

Reference signal generator 214 generates a reference signal 218. Reference signal 218 may include one or more reference levels to which input signal 102 is compared. In an embodiment, reference signal generator 214 may be a reference ladder including a plurality of resistors electrically connected in series. Buffered input signals 216 and reference signal 218 are input to ADC core 204 via amplifier 106. In alternate embodiments, reference signal 218 may be electrically connected to other parts of ADC core 204. For example, reference voltages 218 may be electrically connected instead to comparator block 108.

In an embodiment, comparator block 108 includes logic block 110, as described in reference to FIG. 1. In an alternate embodiment, ADC 200 may additionally include logic block 110.

As shown in FIG. 2, DAC 210 is made up of a plurality of DAC cells 212. In embodiments, DAC cells 212 may include current sources and/or voltage sources.

In an ideal operating case, i.e. without any noise or other unexpected signals, an output of each comparator of comparator block 108 should be 0 when each reference level of reference signal 218 is held at the same potential as buffered input signal 216. Taking into account thermal noise, the outputs of each comparator should conform to well-known statistical models and have a time average of 0. However, when transistor mismatches in a data path cause a mismatch offset, the outputs of the comparators will have a non-zero time average.

Thus, in a non-ideal case the input to each comparator of comparator block 108 has a net offset. The net offset is an algebraic (i.e. taking sign into account) sum of all offsets present at the input of a comparator of comparator block 108. In general, each comparator of comparator block 108 will have an uncorrelated net offset. Typically this net offset includes a thermal offset and a mismatch offset and may be positive, negative, or zero. Since thermal offset has a 0 time average, correcting the mismatch offset would be the primary goal in a calibration process. To correct for a non-zero offset, DAC 210 introduces a DAC generated offset configured to oppose the offset present at the input of the comparator.

A comparator of comparator block 108 will tend to have more 1s than −1s if the offset present at the input of the comparator is positive and more −1s than 1s if the offset at the input of the comparator is negative. Thus, information about the offset present at each comparator can be obtained from the output of the comparator. This information may be used to calibrate each comparator.

To facilitate a calibration process, calibration control 208 is connected to DAC 210, input buffer 202, and reference voltage generator 214. Calibration control 208 may include a variety of sub-elements such as one or more digital processing unit and is used to control various aspects of a calibration procedure for ADC 200. When a calibration procedure is initiated, calibration control sends a signal to both reference signal generator 214 and input buffer 202 which results in each reference level of reference signal 218 and buffered input signal 216 being held at the same voltage. Calibration control 208 samples outputs of each comparator of comparator block 108. Since the offset of each comparator of comparator block can be treated independently, the calibration procedure will be described herein with respect to a single comparator and can be extended to other comparators included in ADC 200.

If an output of a comparator tends to have more 1s than −1s, then calibration control 208 sends a signal to DAC block 210 to generate negative DAC offset at the input of the comparator in response to the apparently positive offset voltage. Conversely, if the output tends to have more −1s than 1s, then calibration control 208 sends a signal to DAC block 210 to generate a positive offset at the input of the comparator in response to the apparently negative offset voltage. This process of sampling the output the comparator and adding a DAC generated offset at the input of the comparator continues until the outputs of the comparator have substantially the same number of 1s and −1s, or if the output is made up mostly 0s indicating the net offset at the input of the comparator is substantially zero, or if the net offset at the input of the comparator switches sign indicated by a switch in the trend of 1s and −1s.

Figure 3:
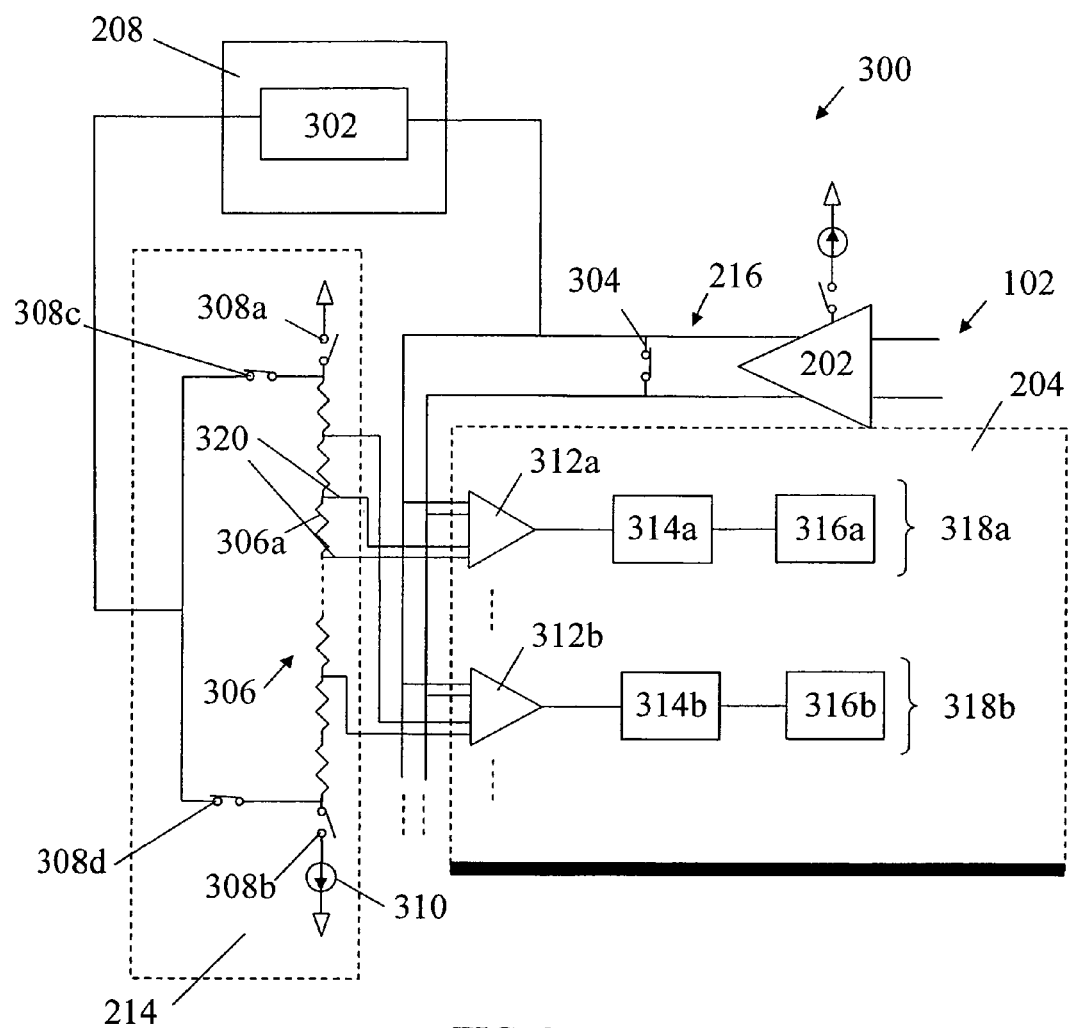
FIG. 3 shows a circuit diagram of an ADC, according to another embodiment of the present invention.

FIG. 3 shows an implementation diagram of an ADC 300, according to an embodiment of the present invention. ADC 300 is substantially similar to ADC 200 as described in reference to FIG. 2. Calibration control 208 includes a voltage source 302 that is electrically connected to buffered input 216. As shown in FIG. 3, input 102 and buffered input 216 are both differential signals. A switch 304 electrically connects both parts of buffered input 216 together which may be held at a common voltage through voltage source 302. In alternate embodiments, one or both of buffered input signal 216 and input signal 102 may be single ended. Voltage source 302 may be a common mode feedback circuit that holds a constant voltage.

As shown in FIG. 3, ADC core 204 is made up a plurality of slices 318. Each slice includes an amplifier, interpolator, and a comparator. For example, slice 318a includes amplifier 312a, interpolator 314a, and comparator 316a. Each slice 318 is identical in structure and function, but receives a different reference voltage from reference voltage generator 214.

Reference signal generator 214 includes a plurality of resistors 306, and switches 308a-d. In normal operation switches 308a and 308b are closed and a current source 310 drives a current through resistors 306 creating a voltage drop across resistor. A voltage drop across a certain number of resistors of resistors 306 is input to an amplifier of a particular slice. For example, a voltage drop 320 across a resistor 306a is input to amplifier 312a of slice 318a. In alternate embodiments, reference voltages may be taken from each node of reference ladder 306.

During calibration switches 308a and 308b are open so that there is no current through reference ladder 306. Switches 308c and 308d are closed such that all points in reference ladder 306 are held at an identical voltage through voltage source 302. So, each amplifier 312 will have an identical set of inputs, i.e., a reference signal and buffered input signal 216, that are both set by voltage source 302.

Since the mismatch offset of a particular slice is distributed randomly and uncorrelated from every other slice, each slice can be calibrated independently. Thus each slice will be calibrated independently by a dedicated DAC and digital processing unit. In an embodiment, each digital processing unit is a part of calibration control 208.

Figure 4:
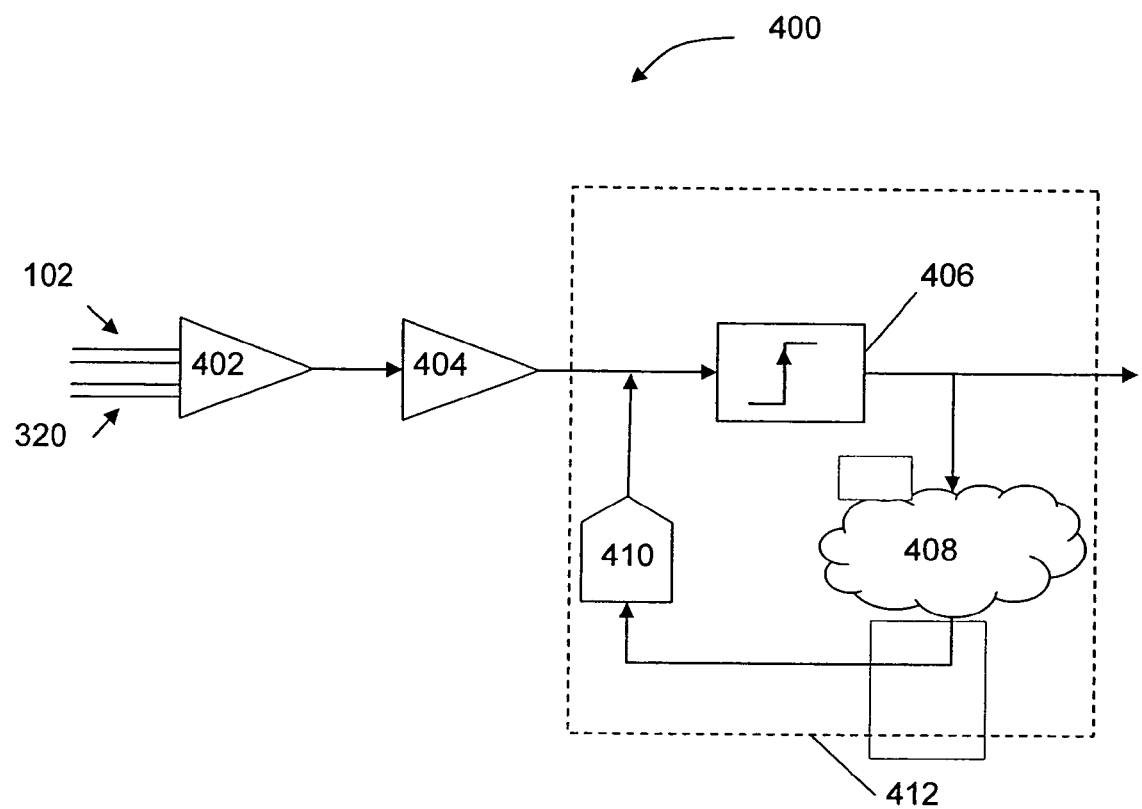
FIG. 4 shows a block diagram of an ADC slice, according to an embodiment of the present invention.

FIG. 4 shows an example slice 400, according to an embodiment of the present invention. In an embodiment, slice 400 is one of many slices of an ADC. Slice 400 includes a comparator 406, a digital processing unit 408, and a DAC 410. Slice 400 optionally includes an amplifier 402 and an interpolator 404. Amplifier 402, interpolator 404, and comparator 406 are generally similar to amplifier 312*a*, interpolator 314*a*, and comparator 316*a* respectively, as described with reference to FIG. 3.

An output of comparator 406 is electrically connected to digital processing unit 408. Digital processing unit 408, in conjunction with a DAC 410, generates an offset to an input of comparator 406. The offset provided by digital processing unit 408 and DAC 410 effectively acts as a correction to the mismatch offset. The input to comparator 406 is chosen as a correction point for many reasons. The correction point may also be chosen at the input to amplifier 402. In such an embodiment, however, offset correction may interfere with the operation of interpolator 404 and may cause other slices within the ADC to be affected resulting in a correlation between the offsets for each comparator which may require all slices of an ADC to be calibrated together. Having to calibrate all slices together may result in dramatic increase in the level complexity in a calibration control circuit. For ADCs that do not use interpolation, choosing the correction point at the input of comparator 406 may still increase the speed of the ADC and reduce the total area of the ADC. Moreover, in such an embodiment where the correction point is chosen to be at the input of amplifier 406, input buffer 202 (not shown) would have to drive additional loading from DAC 410 causing degradation in a bandwidth of input buffer. Thus, choosing the correction point at the input of comparator 406 and configuring DAC 410 to have relatively small loading, minimizes the loading added to each data path. However, this does not preclude choosing any other point in the data path as the insertion point for offset correction.

Comparator 406, digital processing unit 408, and DAC 410 form a calibration loop 412 that calibrates ADC slice 400. DAC 410 is designed based on many factors such as speed, a size of a lowest significant bit (LSB), and a dynamic range. Since the mismatch offset voltage is a substantially static property of ADC slice, a relatively low speed DAC, compared to the speed of the ADC, can be used so the power consumption of DAC 410 is reduced.

DAC 410 outputs an analog signal at a series of different levels. The size of the LSB of DAC 410 represents how fine this series of levels can be. In other words, the size of the LSB of DAC 410 measures the smallest difference possible between a first output level of DAC 410 and a second output level of DAC 410.

The dynamic range, or the DR, of DAC 410 is the range of values that can be output, i.e. the difference between the most positive possible output of DAC 410 and the most negative possible output of DAC 410.

In first order approximations, the size of the LSB and the dynamic range depend on the overall small signal gain between an input of amplifier 402 and an input of comparator 406, $A_{ADC}$, the offset at the input of amplifier 402 without calibration, $\sigma_{ADC}$ and the size of the LSB of the ADC, $LSB_{ADC}$. Relationship 1 and relationship 2 show the relationship between the abovementioned factors and the requirements for the size of the LSB of the DAC, $LSB_{DAC}$ and the dynamic range of the DAC, $DR_{DAC}$:

$$DR_{DAC} > 2A_{ADC}*(3\ \sigma_{ADC}) \quad (1)$$

$$LSB_{DAC} < 0.5*(LSB_{ADC}*A_{ADC}) \quad (2)$$

Relationship 1 and relationship 2 show that having the correction point at the input of comparator 406 increases the requirement of dynamic range of DAC 410 by a factor of $A_{ADC}$ while relaxing the requirement of the size of the LSB by a factor of $A_{ADC}$. In a first order approximation, an area of a thermometer-coded DAC is directly linearly proportional to the dynamic range while the area is inversely proportional to the square of the size of the DAC LSB ($LSB_{ADC}$). Overall, in a first order approximation, the overall area of DAC 410 as a function of the dynamic range and size of the LSB requirements decreases as $A_{ADC}$ increases when the correction point is chosen to be at the input to comparator 406. Thus, choosing the correction point at the input of comparator 406 helps to reduce the area of DAC 410.

Although the above approximations are based on thermometer-coded DACs, other types of the DAC may also be used to implement the present invention.

Figure 5:
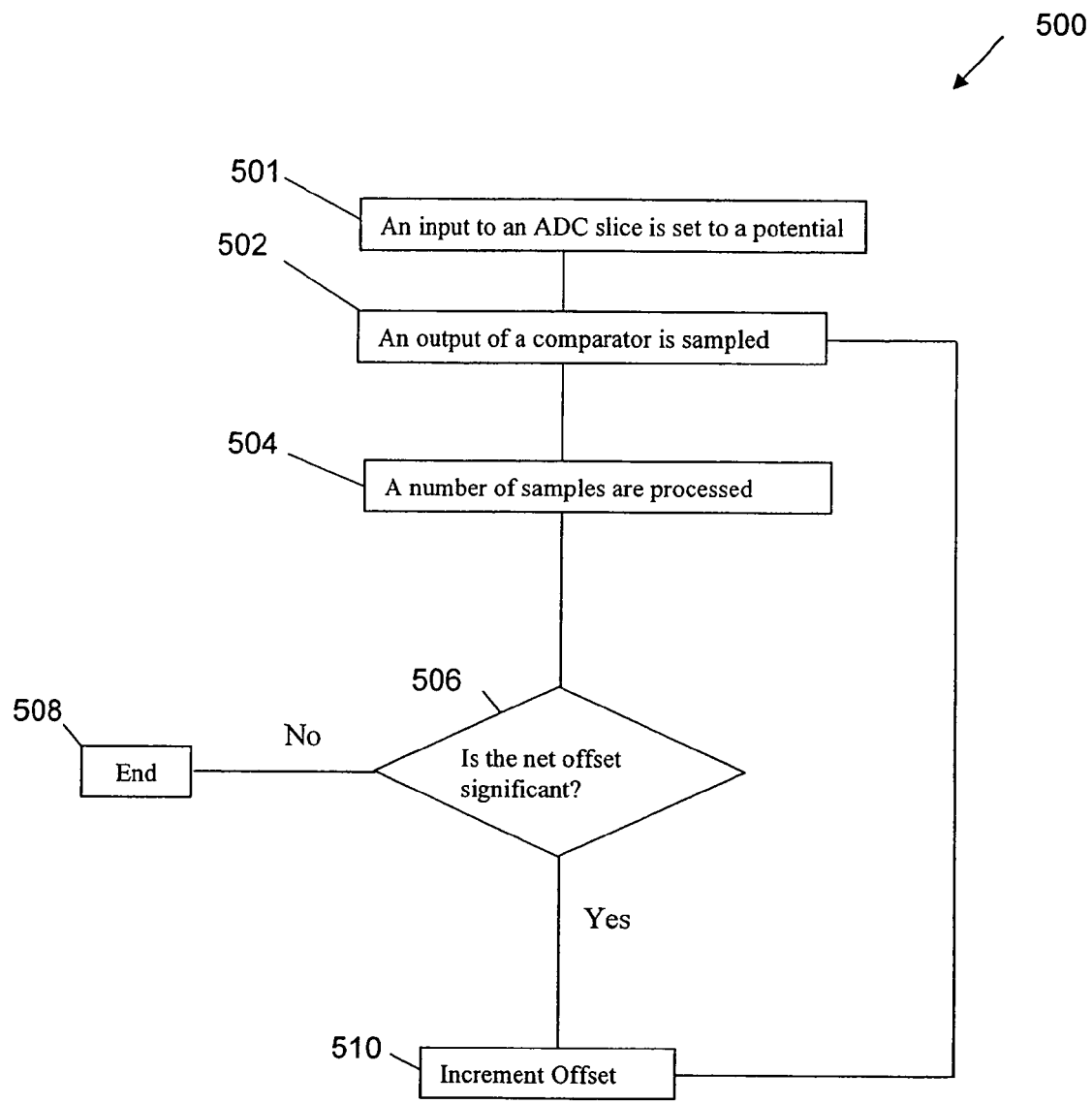
FIG. 5 shows a flowchart providing example steps for calibrating an ADC, according to an example embodiment of the present invention

FIG. 5 shows a flowchart 500 providing example steps for calibrating an ADC, according to an embodiment of the present invention. Other structural and operational embodiments will be apparent to persons skilled in the relevant art(s) based on the following discussion. The steps shown in FIG. 5 do not necessarily have to occur in the order shown. The steps of FIG. 5 are described with reference to FIG. 4, but are not limited in that regard.

Flowchart 500 begins with step 501. In step 501, an input to a slice is set to a potential. In an embodiment, the input to the slice is set to ground. For example, in FIG. 4, input signal 102 and voltage drop 320 may be set to ground.

In step 502, an output of a comparator is sampled. For example, in FIG. 4, digital processing unit 408 samples the output of comparator 406.

In step 504, a number of samples are processed. The number of samples may be processed to determine various indicators that may be used to infer information regarding a net offset present. The net offset is the algebraic sum of all the offsets present. The net offset may include an offset generated by a DAC, a mismatch offset, etc. For example, digital processing unit 408 may compute a sum, average, and/or mode of the number of samples.

In decision step 506, the determined indicators are used to infer whether there is significant net offset at the input to the slice. A significant net offset may include offsets that are large enough to cause errors in the output of the slice. Additionally or alternatively, a significant net offset may be determined based on the size of a LSB of the DAC.

For example, in FIG. 4, digital processing unit 408 may compare a sum of the number of samples to a threshold. If the sum is greater than the threshold, digital processing unit 408 may infer that the net offset is significant. Alternatively or additionally, digital processing unit 408 may also compare a polarity of the sum to a previously computed sum and/or compare a mode of the number of samples to zero. A net offset may be considered insignificant if the polarities of the sums are different and/or if the mode of the number of samples is zero.

If it is determined that the net offset is not significant, flowchart 500 ends at step 508.

If the net offset is determined to be significant, flowchart 500 proceeds to step 510. In step 510, a DAC generated offset is incremented. For example, in FIG. 4, digital processing unit

408 may transmit a signal to DAC 410 that results in the DAC generated offset being incremented to oppose the net offset present at the input to slice 400.

As shown in FIG. 5, flowchart 500 returns to step 502. In an embodiment, steps 502, 504, 506, and 510 are repeated until the net offset is inferred to be insignificant and step 508 is reached.

Figure 6:
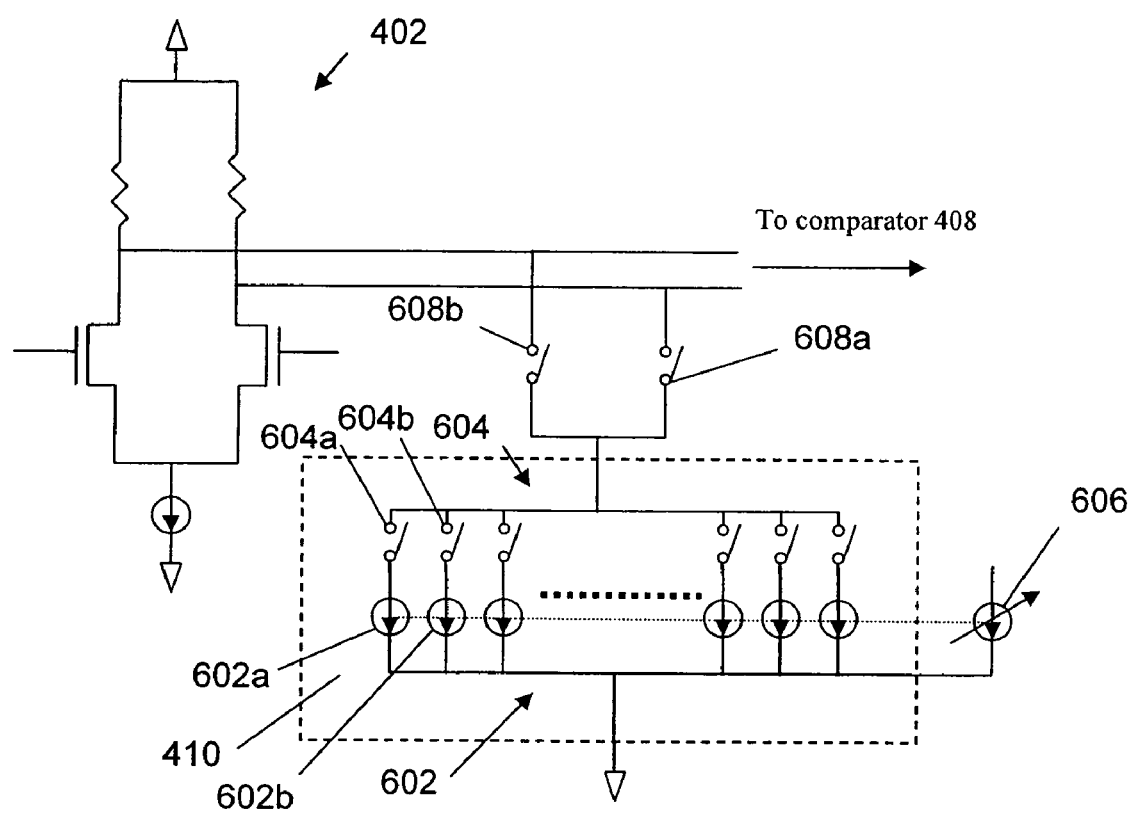
FIG. 6 shows a circuit diagram of an aspect of an ADC slice, according to an embodiment of the present invention.

FIG. 6 shows a circuit level implementation of an aspect of a slice of an ADC, according to an embodiment of the present invention. FIG. 6 shows amplifier 402 implemented as a differential amplifier. Differential amplifier 402 operates as would be expected by persons skilled in the relevant art(s). In an embodiment, differential amplifier 402 provides a gain to an input signal. However, in alternate embodiments, differential amplifier 402 serves as a buffer with a gain of substantially 1 (or −1).

FIG. 6 shows DAC 410 implemented as a thermometer DAC including a plurality of current sources 602 connected to the output of amplifier 402 through a plurality of switches 604, and switches 608a and 608b. In alternate embodiments, DAC 410 may be implemented as a plurality of voltage sources, a combination of current sources and sinks, or may not be implemented as a thermometer DAC, as would be understood by persons skilled in the relevant art(s). Switches 608a and 608b control the polarity of the generated offset current produced by DAC 410 to correct for a net offset present at an input of comparator 406 (not shown). The generated offset current is expected to have a small magnitude, thus switches 608a and 608b along with plurality of switches 604 can be relatively small.

In a calibration procedure, current sources of current sources 602 are selectively enabled by closing corresponding switches of switches 604. In an embodiment, current sources of current sources 602 are enabled iteratively during a calibration procedure. In such an embodiment, if a non-zero net offset is inferred to be present, a first current source 602a is enabled by closing a first switch 604a. Information regarding a net offset is then inferred again. Based on the updated information, a second current source 602b may be enabled by closing a second switch 604b. Such a process may be continued until the net offset is inferred to be substantially close to zero.

The total current sourced by DAC 410 is determined by the states of plurality of switches 604 and a reference current generated by a reference current generator 606. Increasing the reference current increases the dynamic range of DAC 410 while also increasing the size of the LSB. When the calibration loop formed by comparator 406, digital processing unit 408, and DAC 410 (see FIG. 4), is enabled, the offset without any calibration may be expressed through equation 1:

$$\text{Offset\_input} = \text{LSB}_{DAC}/A_{ADC} \quad (1)$$

In ideal operation, corresponding inputs of successive outputs of an ADC differ by one LSB. However, in many cases the ADC may exhibit a differential non-linearity (DNL) that causes the input difference corresponding to successive outputs to be larger or smaller than one LSB. DNL is an important performance measure of ADCs and is dependent on the mismatch offset voltage. As shown by equation 1, the input referred offset voltage can be reduced by reducing the size of the LSB. This reduction in the size of the LSB also reduces the range of offsets that DAC 410 can correct. As the value of the mismatch offset voltage is statistically distributed, the largest such offset in a given data path can vary considerably. Thus in a case where the mismatch voltage is relatively small, the reference current can be reduced to reduce the size of the LSB to decrease the DNL of the ADC. In the case where the mismatch voltage is relatively high, the reference current to increase the dynamic range of DAC 410 at the expense of the DNL.

In an embodiment, the $\text{DR}_{DAC}$ is configured to be capable to generate an offset to correct for 99.7% of all possible mismatch offsets, as determined by the statistical distribution of the mismatch offset and equation 1.

ADC slice 400, shown in FIG. 4 with portions implemented in an exemplary circuit level implementation in FIG. 6, allows for high speed ADC operation to proceed independently of the calibration. Instead of increasing the size of transistor, the present invention allows for a low speed DAC circuit that incurs minimal overhead in loading to automatically correct the mismatch offset voltage and to reduce the time-invariant dynamic offset of the comparator. Since the digital processing unit and the DAC in the calibration loop can operate at a much lower speed compared to the ADC slice, the power consumption of the calibration loop is relatively small compared to the ADC slice. Furthermore, the additional flexibility derived from the reference current allows for increased linearity in cases where the mismatch offset voltage is relatively small and increased dynamic range where mismatch offset voltage is relatively large.

Thus, a modular DAC-calibrated ADC allows for a reduction in ADC power consumption compared to mismatch voltage offset reduction by increasing the size of transistors in a data path. An independent calibration for each comparator in a flash ADC by using a dedicated DAC for each comparator provides the flexibility to many different ADC architectures. The adjustment of calibration accuracy and calibration range can also be optimized by adjusting the size of the LSB and the DR of the DAC and through the number of bits of the DAC.

Example Method Embodiments for ADC Calibration

Figure 7:
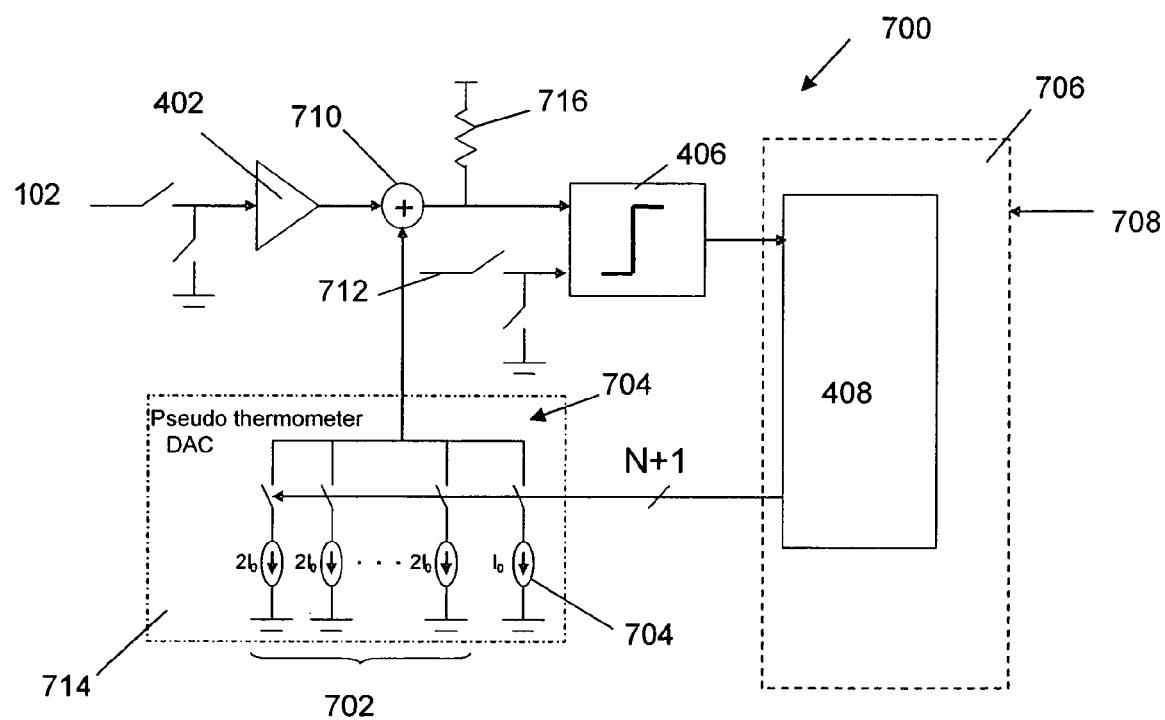
FIG. 7 shows circuit diagram of an ADC slice, according to an embodiment of the present invention.

FIG. 7 shows a block schematic diagram of an ADC slice 700, according to an embodiment of the present invention. ADC slice 700 may be one of many slices that make up an ADC. In a 6-bit flash ADC, 63 comparators are required in a flash architecture. In general, if an n-bit flash ADC is desired, $2^n-1$ comparators are required in a flash architecture.

ADC slice 700 includes amplifier 402, comparator 406, a calibration control 706 and a DAC 714. Calibration control 706 includes the functionality of calibration control 208 described in reference to FIG. 2 and also includes digital processing unit 408. The operation of amplifier 402 and comparator 406 is generally similar to amplifier 402 and comparator 406 shown in FIG. 4. In the embodiment shown in FIG. 7 reference signal 712 is input directly to comparator 406. In alternate embodiments, reference signal 712 may be input into amplifier 402. As shown in FIG. 7, both input signal 102 and reference level 712 are shown to be single ended, however, in alternate embodiments, one or both of input signal 102 and reference level 712 may be differential signals.

Also, as shown in FIG. 7, input signal 102 is directly input to amplifier 402, however, in alternate embodiments input signal 102 may be input into an input buffer then input into amplifier 402, as shown in FIG. 3.

In the embodiment shown in FIG. 7, DAC 714 is implemented as a pseudo thermometer DAC. A DAC pseudo thermometer DAC is generally similar to a thermometer DAC, such as the implementation of DAC 410 shown in FIG. 7, except includes at least one cell (i.e., a voltage source or current source) whose magnitude is different than other cells of the DAC. DAC 714 includes a plurality of current sources 702 that each sources a current $2I_0$. DAC 714 also includes a current source 704 that sources a current $I_0$. Current source 704 controls the size of the LSB of DAC 714. A thermometer DAC architecture is typically used to ensure monotinicity in which cells are activated as required. Such a DAC also requires a large number of interconnects. A pseudo-thermometer DAC shown in FIG. 7 reduces the number of interconnects by almost half without sacrificing montinicity.

Each time a current source of plurality of current sources 702 is activated, a DAC code for DAC 714 is increased by 2 codes. When current source 704 is activated, the DAC code increases by 1 code. Thus, 1 DAC code represents the size of the LSB of DAC 714.

In normal operation, an addition block 710 adds an output of amplifier 402, which is a scaled version of input 102, and a DAC signal produced by DAC 410.

In an embodiment, the output of amplifier 402 is a voltage signal. In such an embodiment, a resistor 716 may be used to effectively convert a current signal generated by DAC 714 into a voltage signal. In such an embodiment, addition block 710 is a node.

To start a calibration procedure, a control signal 708 is input to calibration control 706. Calibration control 706 responds to signal 708 by holding the input to amplifier 402 and reference level 712 at the same potential, as shown in FIG. 3. For more information regarding this procedure, see FIG. 2 and the description thereof.

Digital processing unit 408 controls the input to DAC 714. Digital processing unit 408 then may send a signal corresponding to the sign of the net offset to DAC 714 to activate a current source of plurality of current sources 702. The signal resulting from the activating of the current source is then added to the input at comparator 406. The sign of the current added to the input signal is determined by the status of switches 608a and 608b, as shown in FIG. 6. In reference to FIG. 6, the sign of the current added when switch 608a is closed and switch 608b is open is opposite to the sign of the current added when switch 608b is closed and switch 608a is open. An addition block 710 adds the DAC current produced by DAC 410 to the output of amplifier 402. To perform this addition, the DAC current is converted to a voltage by a resistor 716. In an embodiment, addition block 710 is a node where the DAC current, resistor, and input to the comparator intersect. Resistor 716 effectively converts a current signal from DAC 714 to a voltage signal that can be added to the output of amplifier 402.

After generating an offset to correct for the initial net offset present at the input to comparator 406, the output of comparator 406 is sampled again to determine if there still exists a substantially non-zero net offset at the input of comparator 406 to be corrected and the polarity of the net offset voltage. The process continues until the output of the comparator tends to have an equal number of 1s and −1s or if the output is mostly 0s. The criterion used by digital processing unit 408 to determine whether another iteration is required will be discussed in further detail below.

Figure 8:
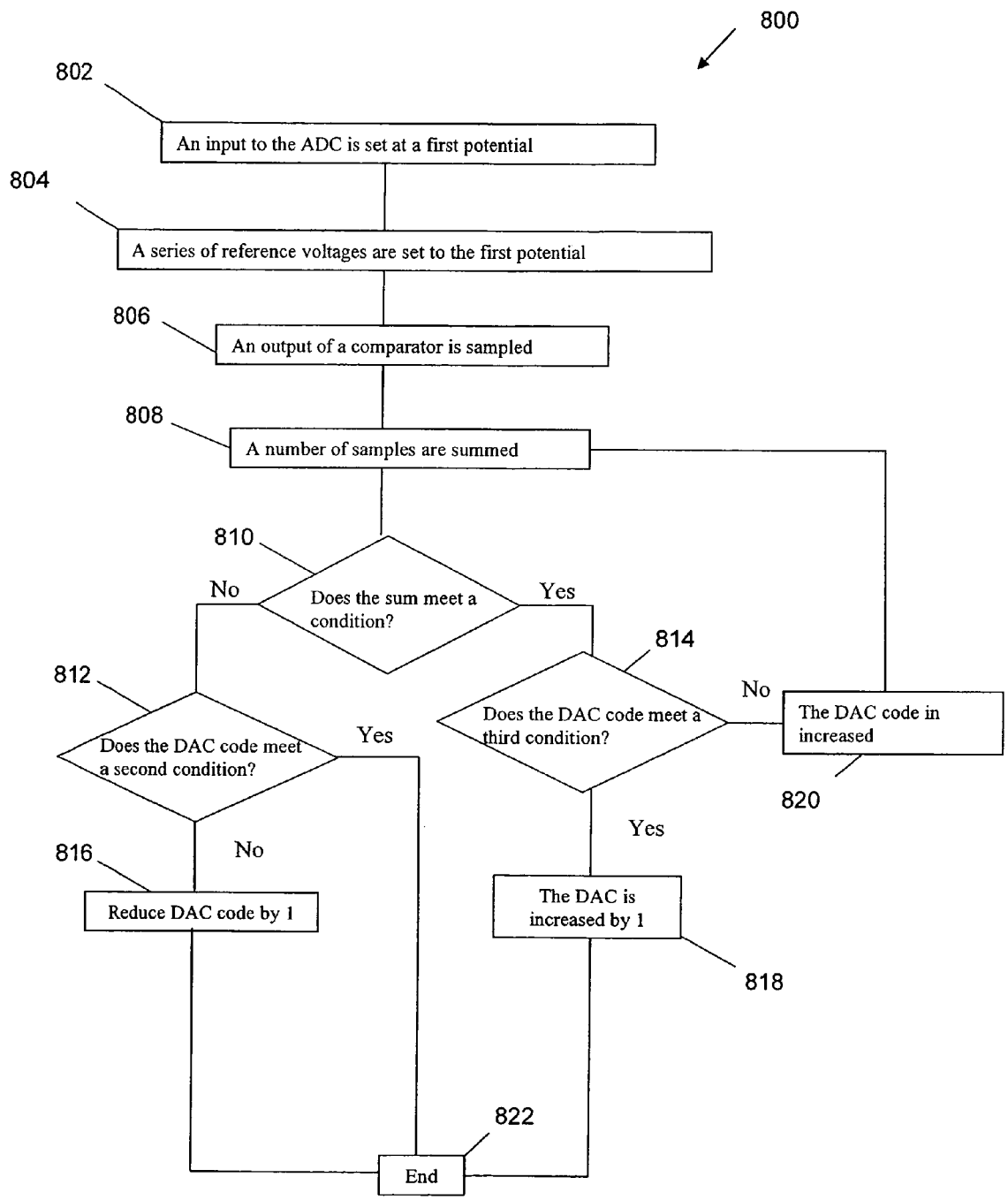
FIG. 8 shows a flowchart providing example steps for calibrating an ADC, according to an example embodiment of the present invention.

FIG. 8 shows a flowchart 800 providing example steps for calibrating an ADC, according to an embodiment of the present invention. Other structural and operational embodiments will be apparent to persons skilled in the relevant art(s) based on the following discussion. The steps shown in FIG. 8 do not necessarily have to occur in the order shown. The steps of FIG. 8 are described in detail below.

The steps of flowchart 800 are described with respect to a DAC code. The DAC code refers to an offset generated by a DAC that calibrates the ADC. An increase in a DAC code corresponds to an increase in a total offset generated by the DAC. Conversely, a decrease in a DAC code corresponds to a decrease in a total offset generated by the DAC. An increase or decrease in a DAC code by 1 indicates that the total offset generated by the DAC has changed by the size of one LSB.

The number of possible codes in a pseudo-thermometer DAC such as DAC 714 in FIG. 7 can be expressed as 2(N+1) while there are only N+1 control signals, where N is the number of $2I_0$ current sources in DAC 714. A traditional thermometer DAC has 2N−1 control signals.

Flowchart 800 begins with step 802. In step 802, an input to the ADC is set at a first potential. In an embodiment, the input to the ADC is grounded. For example, in FIG. 3, voltage source 302 of calibration control 208 sets buffered input signal 216 to a first potential. In a further embodiment, voltage source 302 is a common mode feedback circuit. In alternate embodiments, input signal 102 may be set to the first potential.

In step 804, a series of reference voltages that are held by the comparator until calibration are set to the first potential. In an embodiment, the series of references voltages are grounded. For example, in FIG. 3, voltage source 302 sets plurality of reference voltages 320 to the first potential. In an embodiment, a DAC code is also set to a code 0 in which it generates no offset signal. The DAC offset is used to calibrate the ADC.

In step 806, an output of a comparator is sampled. In an embodiment, the output of the comparator is sampled at a predetermined frequency. In a further embodiment, the output of the comparator is sampled by a low frequency clock such as a 40 MHz clock. For example, in FIG. 7, digital processing unit 408, of calibration control 706, samples the output of comparator 406.

In step 808, a number of samples are summed. In an embodiment, 32 samples are summed. Summing the number of samples effectively averages the comparator output so that noise is rejected making the calibration potentially more accurate. For example, in FIG. 7, digital processing unit 408 sums a number of samples of the output of comparator 406.

In step 810, the sum is compared to a condition. If the sum does not meet the condition, the calibration procedure proceeds to step 812. If the sum does meet the condition, the calibration procedure proceeds to step 814. In an embodiment, the condition is whether the sum is larger than half the number of samples. Thus, if the sum is greater than half the number of samples then the calibration procedure proceeds to step 812 and if the sum is less than half the number of samples the calibration procedure proceeds to step 814. In a further embodiment, the absolute value of the sum is considered rather than the sum itself. The sign of the sum may affect a sign of a DAC offset added to an input to the comparator. In a still further embodiment, 32 samples are summed.

If the sum does not meet the condition, step 812 is reached. In step 812, the DAC code is compared to a second condition. If the DAC current meets the second condition, the calibration procedure proceeds to step 822 and is ended. At step 822, the DAC is considered calibrated. If the DAC current does not meet the condition, the calibration procedure proceeds to step 816. In an embodiment, the second condition is whether the DAC code is 0.

In step 816, the value of the DAC code is reduced by 1. After step 816, the ADC is considered calibrated at step 822. Although step 816 is shown only to proceed after a certain condition is met, in alternate embodiments step 816 may also be executed in all possible cases.

If the sum does meet the condition, step 814 is reached. In step 814, the DAC code is compared with a third condition. If the third condition is met, the calibration procedure proceeds to step 818, if not, the calibration procedure proceeds to step 820. In an embodiment, the third condition is whether the DAC code is 1 less than the largest possible DAC code.

In step 818, the DAC code is increased by one. In an embodiment, the total DAC offset at the end of step 818 is the maximum DAC code. After step 818, ending step 822 is reached, and the ADC is considered calibrated In step 820, the DAC code increased. In an embodiment, the DAC code is increased by two. After step 820, flowchart 800 proceeds to step 808 and the output of the comparator is sampled again.

Although flowchart 800 has been described with respect to an ADC, the steps of flowchart 800 may also be applied to an ADC slice of a flash ADC. Once the calibration is completed, the results of the calibration procedure may be stored for future use.

Also in alternate embodiments, the calibration procedure may start with a maximum DAC offset code or any value between the maximum and minimum DAC offset and proceed from there, as would be understood by persons skilled in the relevant art(s).

Figure 9:
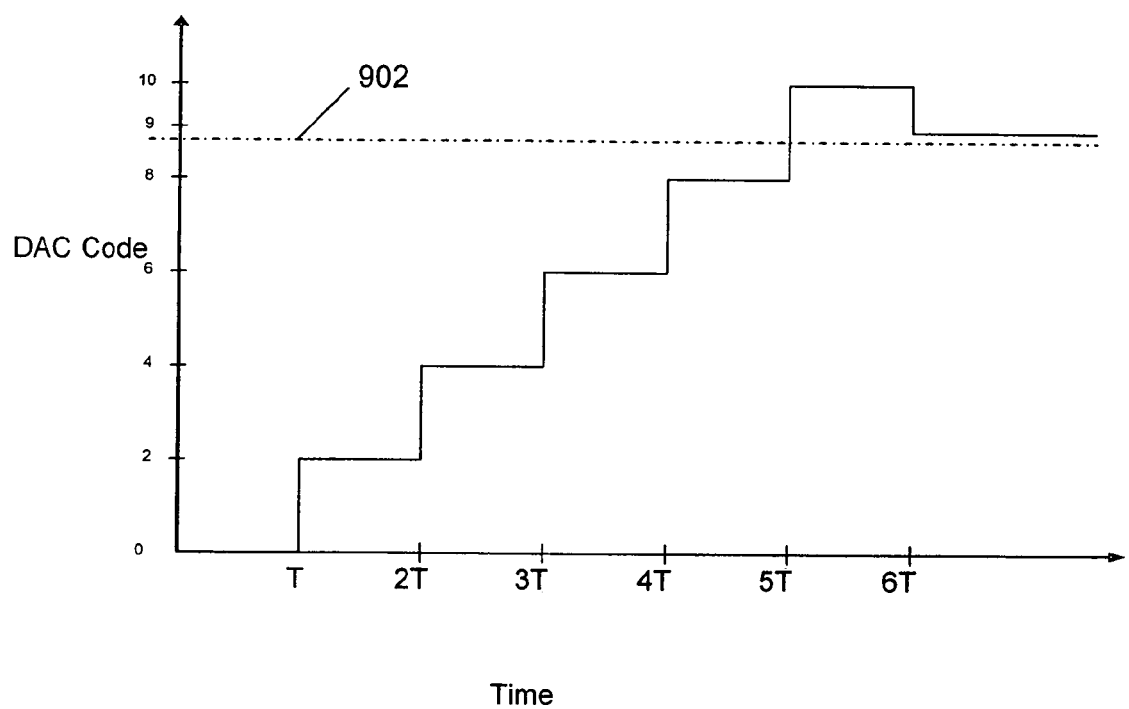
FIG. 9 shows a graph indicative of an exemplary calibration procedure.

FIG. 9 shows an example use of the calibration procedure illustrated in FIG. 8, according to an embodiment of the present invention. The example will be described in reference to ADC slice 700 shown in FIG. 7, but is not limited to that type of ADC. As shown in FIG. 9, a mismatch offset at the input of comparator 406 902 is equivalent to a DAC code between DAC code 8 and a DAC code 10. For a thermometer DAC, this would be the size of the 1 LSB, while in the pseudo thermometer DAC shown as DAC 714 in FIG. 7, this is double the size of the LSB.

As the calibration procedure begins, the output of comparator 406 is sampled. In the embodiment where the output is sampled at a predetermined frequency of 40 MHz, the output of the comparator is sampled every 25 nanoseconds. A determination regarding the mismatch offset voltage is made at every sum. As shown in FIG. 9, this is done every 'T' interval. In the embodiment where the sum is taken every 32 samples, T is 800 ns. After every sum, digital processing unit 408 determines if an offset is present and if there is, sends a signal to DAC 714 to activate one of its current sources. Enabling a current source of plurality of current sources 702, increases the DAC code by 2. As digital processing unit continues to sum, if there is an offset detected at each sum, a current source of plurality of current sources 702 is activating, increasing the DAC code by 2.

Once DAC 714 reaches DAC code 10, the net offset switches sign, as determined by digital processing unit 408 during the sum of the sample outputs of comparator 406. This indicates to digital processing unit 408 that the mismatch offset can be compensated by a generated offset between DAC code 8 and DAC code 10.

At this point the net offset, i.e. the difference between the mismatch offset voltage and the offset generated by DAC 714 is equivalent to a DAC code −2 to a DAC code 0. Thus the net offset would not be symmetrical about 0 and the absolute value of the maximum offset would be equivalent to a DAC code 2. To reduce the net offset by 1 DAC code, a traditional thermometer DAC would require nearly twice the number of control signals. In contrast, through the use of current source 704, which has a value of $I_0$ or one LSB, i.e. allows for the addition or subtraction of 1 DAC code, the reduction by 1 LSB is done relatively simply. Thus the maximum net offset is reduced to +/−1 LSB while retaining a dynamic range of DAC 714 that is similar to that of a traditional thermometer DAC.

Thus, through the use of the pseudo-thermometer architecture for the DAC and the calibration procedure illustrated in FIG. 8, the total interconnects required to form DAC 714 is reduced by almost a factor of 2, compared to a thermometer architecture, while guaranteeing DAC monotinicity. This reduction of the number of interconnects leads to a more compact overall ADC structure which helps to reduce interconnect parasitic capacitances. The reduction in parasitic capacitances, in turn, leads to lower power use from the ADC when operating at high frequencies. The monotinicity helps to guarantee a more robust calibration procedure.

Moreover, the pseudo thermometer architecture along with the calibration procedure illustrated in FIG. 8 also provides a shorted calibration time. In the traditional thermometer case the maximum calibration time is 2NT, where N is the total number of codes possible in the DAC and T is as described with reference to FIG. 9 above. While in the pseudo thermometer case the maximum total time is (N+1)T, with only NT required to reach the mismatch offset, and the additional T required to reduce by 1 LSB to the final value.

Furthermore, the calibration procedure only has to be done at startup and the DAC code required to calibrate the ADC slice, so very little additional power is required for offset correction during normal operation. This procedure can be done simultaneously for all comparator and DAC pairs of an ADC to save calibration time or sequentially in which case each calibration has a dedicated control but the different calibrations may share a state machine. Simultaneous calibration leads to calibration times that are typically shorter than calibration times that may arise from traditional thermometer DACs while sequential calibration may lead to a significant reduction in the additional area required to implement the ADC calibration architecture.

Example Embodiments for Multi-Precision ADC

Details of structural and operational implementations of programmable precision ADCs in accordance with an embodiment of the present invention are described in the following sections. These structural and operational implementations are described herein for illustrative purposes, and are not limiting.

Figure 10A:
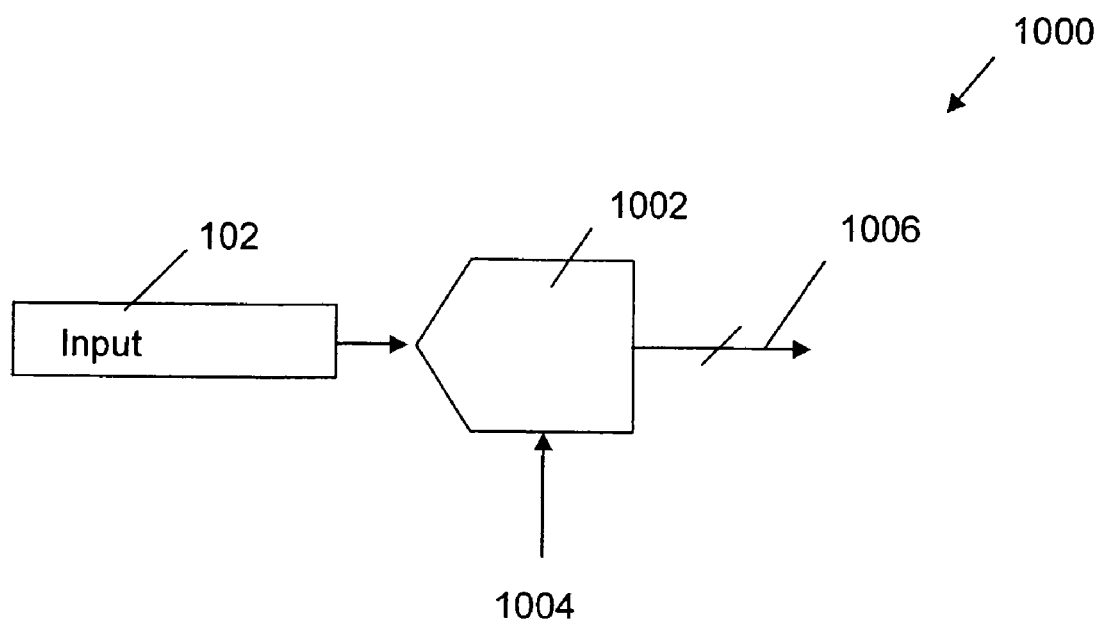
FIGS. 10A and 10B show block diagrams of a programmable precision ADC, according to embodiment of the present invention.

FIG. 10A shows a block schematic of a programmable precision ADC 1000, according to an embodiment of the present invention. ADC 1000 includes an ADC core 1002, a precision control signal 1004, input signal 102, and an output signal 1006 and is configured in an open loop configuration. ADC core 1002 is generally similar to other ADC cores described herein. ADC core 1002 may be a flash ADC core with multiple identical elements, as described above. ADC core 1002 may also have calibration implemented similar to ADC 200 shown in FIG. 2, according to an embodiment of the present invention.

Precision control signal 1004 controls the number of bits that are used to represent input signal 102. The number of bits used to represent input signal 102 may depend on the condition of input signal 102. The condition of input signal 102 may refer to a presence of noise within input signal 102, a distortion of input signal 102, or like thereof and may be detected using well known signal processing techniques, as would be understood by persons skilled in the relevant art(s).

In an embodiment, the condition or quality of an input signal may depend on a signal to noise ratio (SNR) of the input signal. Signals with high SNR may be considered high quality signals and would require fewer bits to be represented and vice versa. In an alternative embodiment, the condition or quality of an input signal may be determined by the likelihood of errors or distortions being present in the signal. In such an embodiment, a signal that has a low likelihood of error or distortion is considered a high quality signal and would require fewer bits to be represented.

Figure 10B:
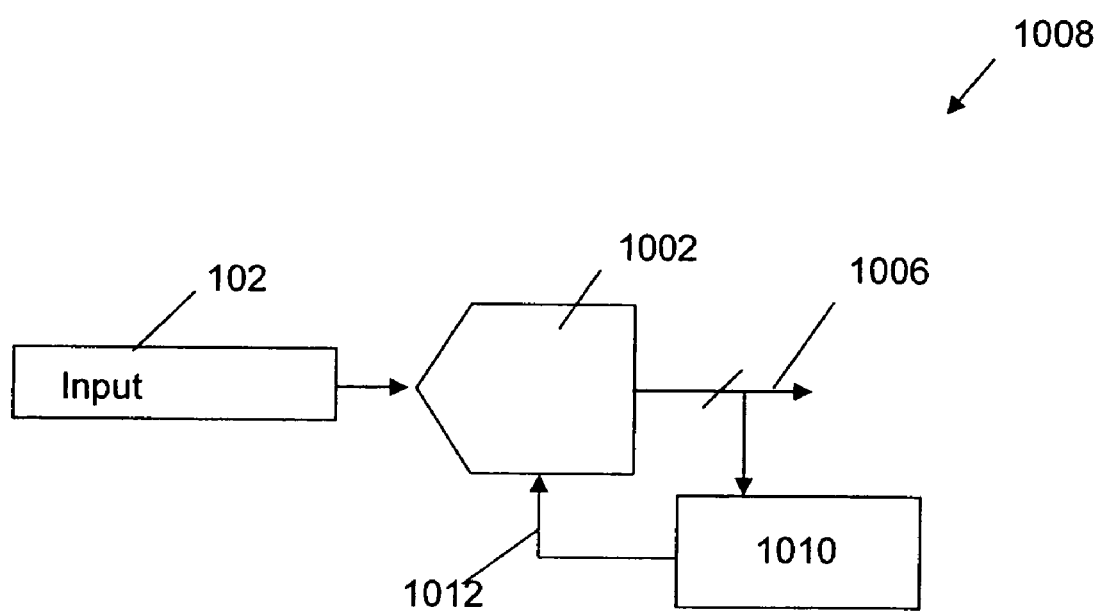

FIG. 10B shows an ADC 1008, according to an embodiment of present invention. ADC 1008 is generally similar to ADC 1000 shown in FIG. 10A, however ADC 1008 also includes a data quality monitor 1010 and is configured in a closed loop configuration. Data quality monitor 1010 monitors the condition, or quality, of input signal 102 and produces a precision control signal 1012 that is generally similar to precision control signal 1004 shown in FIG. 10A.

As shown in FIG. 10B, ADC 1008 implements a closed loop configuration including ADC 1002 and data quality monitor 1010. Data quality monitor evaluates the quality of input signal 102 and adjusts precision control signal 1012 accordingly. As the quality of input signal 102 decreases, more bits are allocated to represent input signal 102. Since the quality of input signal 102 is often slow-varying compared to the speed of ADC 1002, the closed loop configuration can be used to automatically update the number of bits as input signal 102 changes without requiring high-speed processing capability from data quality monitor 1010, as compared to ADC core 1002. Moreover, such a configuration also keeps high speed data paths of ADC core 1002 unchanged. Thus, in low power mode, the overhead of low power operation is relatively small resulting in significant power conservation.

An ADC with a programmable number of output bits allows for power allocation based on the condition of the input signal. When the condition of a signal allows for fewer bits to be allocated, power can be saved. To achieve maximum power reduction, the programmability is implemented in way such that little or no overhead power consumption occurs during normal operation of the ADC. Data paths in ADCs are designed such that they are substantially identical to traditional ADCs. Thus, additional circuitry, such as switches or multiplexers, is not needed in the data path to change data paths into different configurations. Parasitic capacitances also remain substantially similar to those in the case of traditional ADCs.

The programmability in the number of output bits is achieved by adding elements, such as switches, to DC parts of the ADC, such as biasing for various ADC stages and a resistor ladder used as a reference generator.

Figure 11:
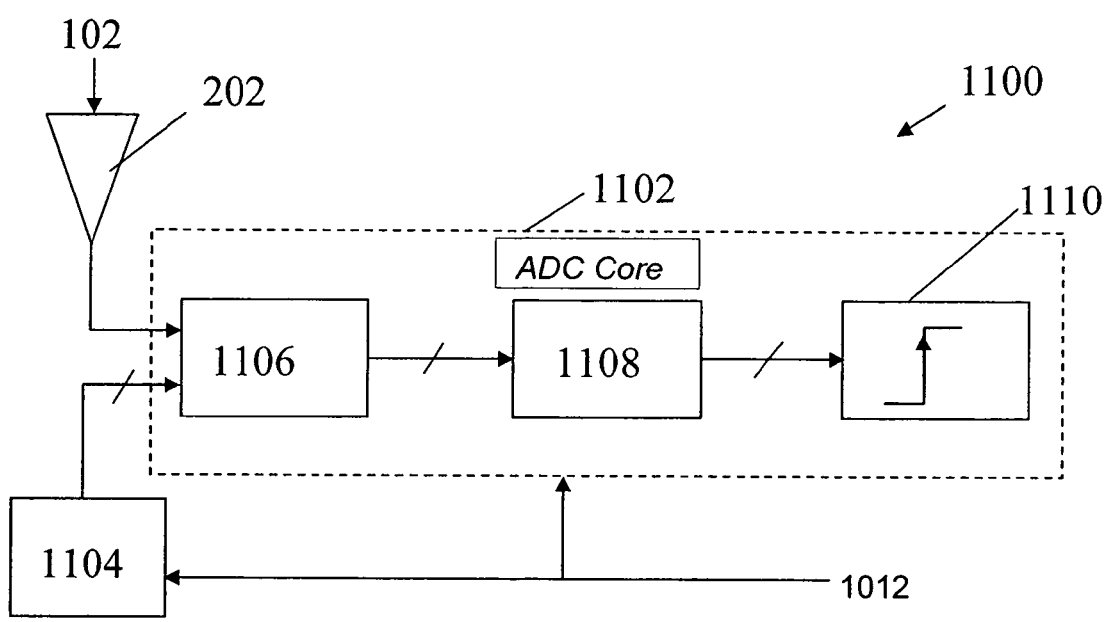
FIG. 11 shows a block diagram of a programmable precision ADC, according to another embodiment of the present invention.

FIG. 11 shows a block diagram of an ADC 1100, according to an embodiment of the present invention. ADC 1100 includes input buffer 202, an ADC core 1102, and a reference signal generator 1104. ADC core 1102 includes an amplifier block 1106, an interpolator block 1108, and a comparator block 1110. The operation of reference signal generator 1104 and the elements of ADC core 1102 are generally similar to reference signal generator 214 and ADC core 204 of ADC 200 as described with reference to FIG. 2, except they include the functionality to accept precision control signal 1012 to adjust settings based on the precision used to represent input signal 102. Amplifier block 1106, interpolation block 1108, and comparator block 1110 may each be made up of a plurality of identical components. In a flash-type ADC, the number of units used to make up each element increases exponentially as the number bits used to represent an input signal increases.

Figure 12:
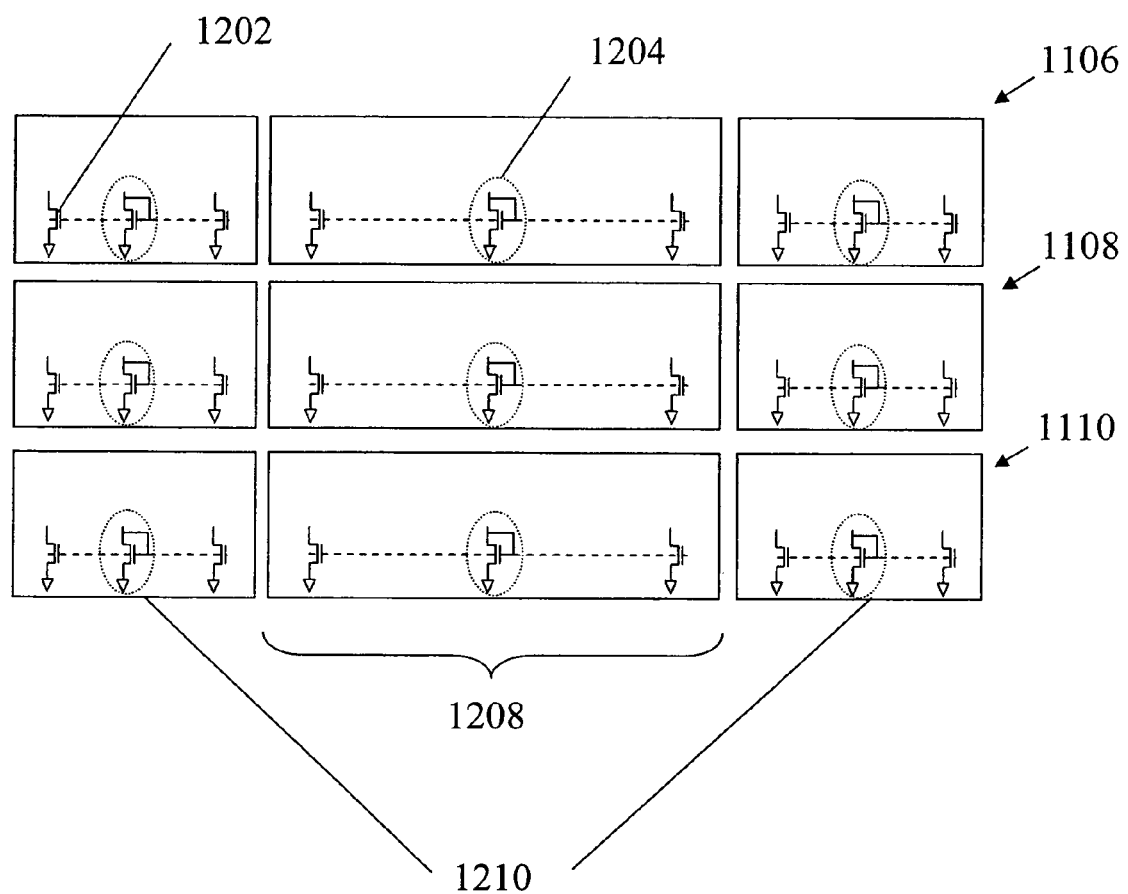
FIG. 12 shows an exemplary circuit diagram of a programmable precision ADC, according to an embodiment of the present invention.

FIG. 12 shows amplifier block 1106, interpolator block 1108, and comparator block 1110 each formed out of a plurality of circuit elements 1202 and a plurality of biasing diodes 1204. Although FIG. 12 shows circuit elements 1202 as being MOS transistors, plurality of circuit elements 1202 could be other elements such as resistors, capacitors, and/or bipolar junction transistors. Using an arrangement similar to FIG. 12, a number of output bits used to represent an input signal may be reduced. For example, to reduce the number of circuits in operation to half, one bit may be removed from the output.

As shown in FIG. 12, each of amplifier block 1106, interpolator block 1108, and comparator block 1110 have a first portion 1208 and a second portion 1210. Biasing diodes 1204 are used to cut-off power to a portion, while leaving another portion operational. For example, power may be cut-off to second portion 1210 while leaving first portion 1208 operational. In an embodiment, first portion 1208 and second portion 1210 may each be half of amplifier block 1106, interpolator block 1108, and comparator block 1110.

Although biasing diodes 1204 are shown to be MOS transistors, in alternate embodiments, biasing diodes may be implemented in other ways, as would be understood by persons skilled in the relevant art(s). Thus, to allow for a 1 bit reduction, and therefore a 50% power reduction, only two additional biasing diodes 1104 need to be added to each block. All of the connections within the ADC are kept intact. Furthermore, there is a negligible increase in power usage and area to allow for the programmability in the number of output bits.

A programmable number of output bits may also be implemented in tandem with ADC calibration using a DAC. Since each comparator of comparator block 1106 is calibrated independently, a separate DAC can be used for each comparator that is active in low power mode, while each DAC dedicated to an inactive comparator may be powered down along with the corresponding comparator.

Figure 13:
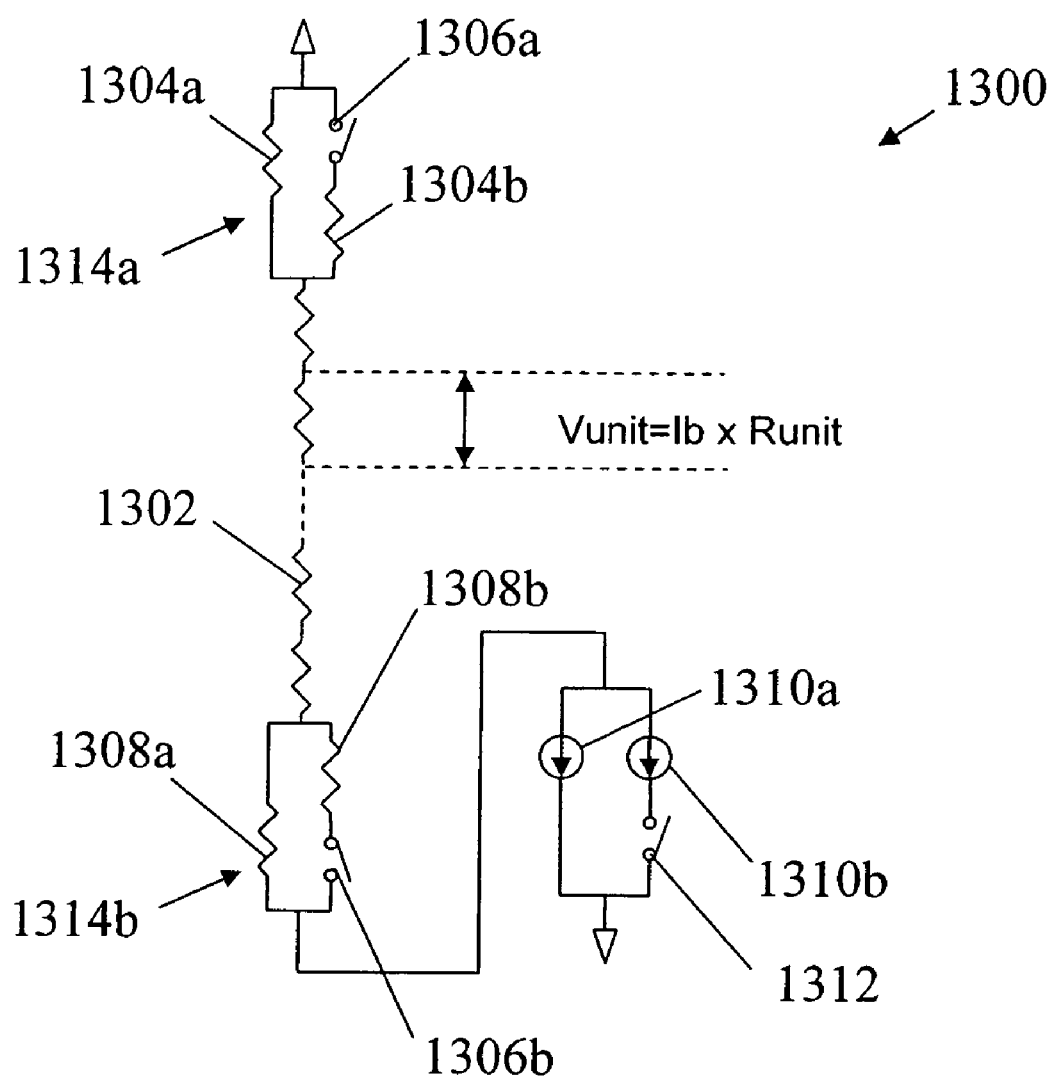
FIG. 13 shows a circuit diagram of a reference generator, according to an embodiment of the present invention.

FIG. 13 shows reference voltage generator 1300, according to an embodiment of present invention. Reference voltage generator includes a plurality of resistors 1302, top resistors 1304a and 1304b, bottom resistors 1308a and 1308b, and current sources 1310a and 1310b. In general if the number of bits on the output of an ADC is reduced by one and the dynamic range is held the same, the size of the LSB doubles. Thus, voltage steps of reference voltage generator 1300 need to be doubled. In the embodiment shown in FIG. 13, this is done by doubling the current through the reference ladder.

When an ADC including reference voltage generator 1300 switches to a lower precision mode, a switch 1312 is closed. Closing switch 1312 puts current source 1310b in parallel with current source 1310a. In an embodiment where current sources 1310a and 1310b source the same current, this doubles the current passing through plurality of resistors 1302. Since a reference voltage generator consumes significantly less power than an ADC, the increase in current passing through the reference voltage generator leads a negligible increase in power consumption, compared to the operation of the rest of the ADC.

Switches 1306a and 1306b are added to adjust the net resistance of a top resistor 1314a and a bottom resistor 1314b so that the voltage range of reference voltage generator is kept the same in both normal and low precision modes of operation.

The voltage steps can also be doubled by combining voltage two steps. This can be done by inserting switches (not shown) between voltage steps. In such a case, an area of reference voltage generator 1300 may increase, but the power consumption would remain substantially similar.

Figure 14:
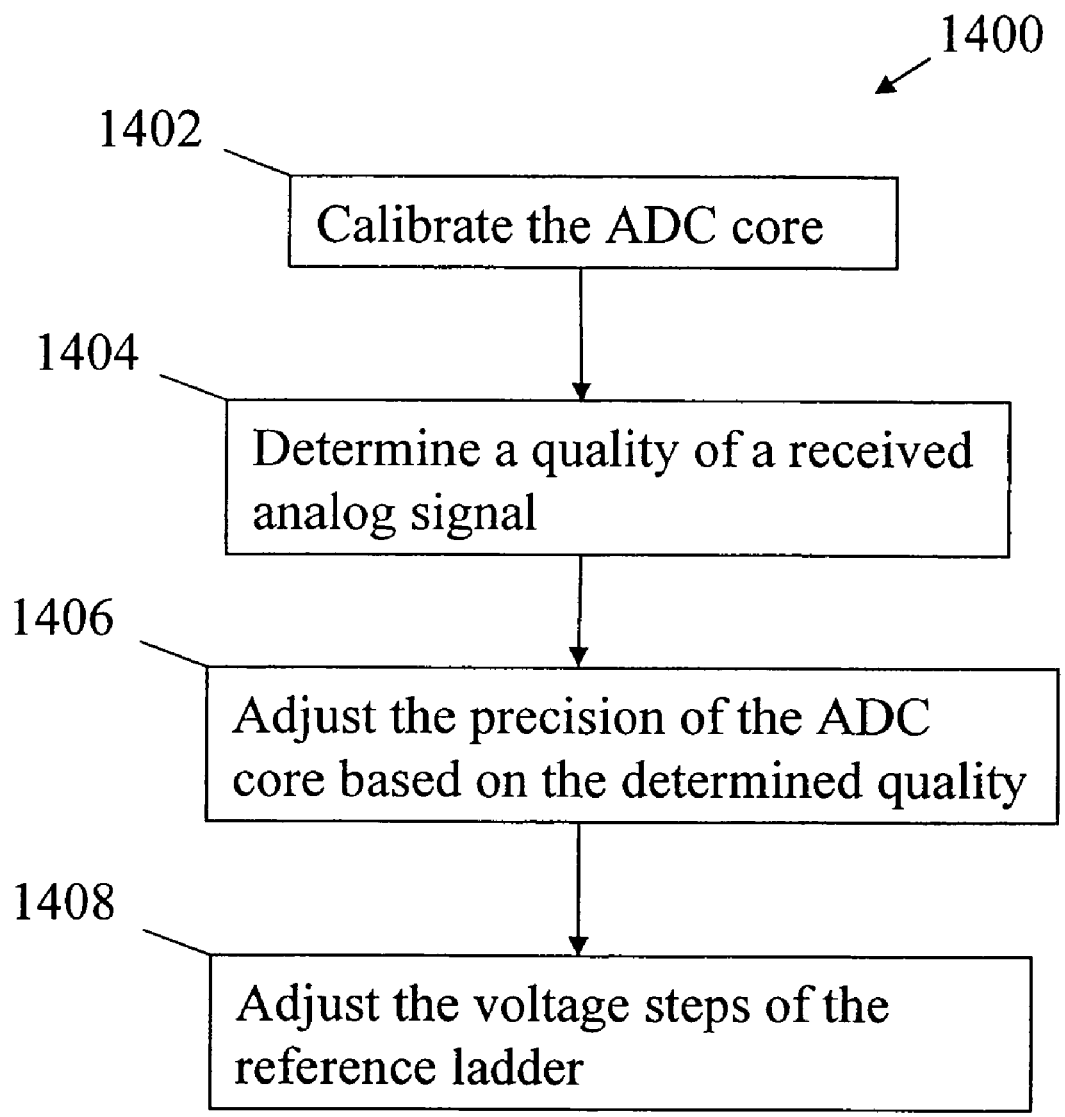
FIG. 14 shows a flowchart providing example steps for converting an analog signal to a digital signal, according to an example embodiment of the present invention.

FIG. 14 shows a flowchart 1400 providing example steps for converting an analog signal to a digital signal, according to an embodiment of the present invention. Other structural and operational embodiments will be apparent to persons skilled in the relevant art(s) based on the following discussion. The steps shown in FIG. 14 do not necessarily have to occur in the order shown. The steps of FIG. 14 are described in detail below.

Flowchart 1400 begins with step 1402. In step 1402, an ADC core is calibrated. For example, an ADC core may be calibrated using steps flowchart 800 described with reference to FIG. 8.

In step 1404, a quality of a received analog signal is determined. For example, in FIG. 10B, data quality monitor 1010 determines a quality of input signal 102.

In step 1406, the precision of the ADC core is adjusted based on the determined quality. In an embodiment, the quality indicates that fewer bits are required to represent the received analog signal. In such an embodiment, power may be cut-off to portions of the ADC core. For example, in FIG. 12, biasing diodes 1204 may be used to cut-off power to second portion 1210 so as to reduce the precision of the ADC core by 1 bit and reduce the power consumed by the ADC by 50%.

In an embodiment, if it is determined that the received analog signal has high quality, the precision of the ADC core may be reduced since fewer bits may be needed to represent the received analog signal. For example, if the received analog signal has a high SNR and/or a low likelihood of errors or distortion, the precision of the ADC core may be reduced. Alternatively, if the received analog signal has low quality, the precision of the ADC core may be increased since more bits may be needed to represent the received analog signal.

In step 1408, voltage steps of a reference voltage generator are adjusted based on the adjustment of the ADC core precision. For example, if the precision ADC is reduced, voltage steps of the reference ladder may have to be increased. For example, in FIG. 13, voltage steps of reference voltage generator 1300 may be increased by increasing the current through reference voltage generator 1300.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An analog-to-digital converter (ADC), comprising:
a reference voltage generator configured to generate reference voltages;
an analog to digital converter core configured to receive an input signal and the reference voltages and to generate a digital signal representative of the input signal, the digital signal having a number of bits; and
a controller configured to determine a quality of the input signal, and, based on the quality of the input signal, to control the number of bits of the digital signal and values of the reference voltages.

2. The ADC of claim 1, wherein the controller is configured to generate a precision control signal that controls the number of bits of the digital signal and the values of the reference voltages.

3. The ADC of claim 1, wherein the controller is configured to decrease the number of bits of the digital signal by cutting off power to a portion of the analog to digital converter core.

4. The ADC of claim 3, wherein the controller is configured to decrease the number of bits of the digital signal by one bit by cutting off power to substantially half of the analog to digital converter core.

5. The ADC of claim 3, wherein the analog to digital converter core includes a biasing element and wherein the controller is configured to cut off power to the portion of the analog to digital core by controlling a state of the biasing element.

6. The ADC of claim 5, wherein the biasing element comprises a diode.

7. The ADC of claim 1, wherein the controller is configured to determine the quality of the input signal based on a signal-to-noise ratio of the input signal or a likelihood of errors being present in the input signal.

8. The ADC of claim 1, wherein the reference voltage generator comprises a switch coupled to a current source, wherein the controller is configured to control the values of the reference voltages by controlling the state of the switch.

9. The ADC of claim 1, wherein the analog to digital converter core comprises a plurality of slices, each slice comprising:
a comparator configured to compare the analog input to a reference voltage and produce an output;
a digital to analog converter (DAC); and
a digital processing unit (DPU) that is electrically connected to the comparator and the DAC;
wherein the DPU is configured to sample the output of the comparator to infer information associated with a first offset and generate a signal from the inferred information and wherein the DAC is configured to receive the signal and generate a second offset that opposes the first offset.

10. The ADC of claim 9, wherein the controller is configured to power up or power down one or more DACs based on the quality of the input signal.

11. An analog-to-digital converter (ADC), comprising:
means for generating reference voltages;
an analog to digital converter core configured to receive an input signal and the reference voltages and to generate a digital signal representative of an input signal, the digital signal having a number of bits; and
means for determining a quality of the input signal, and controlling, based on the quality of the input signal, the number of bits of the digital signal and values of the reference voltages.

12. The ADC of claim 11, wherein the means for controlling is configured to decrease the number of bits of the digital signal by cutting off power to a portion of the analog to digital converter core when the quality of the input signal increases.

13. The ADC of claim 11, wherein the analog to digital converter core comprises a plurality of slices, each slice comprising:
a comparator configured to compare the analog input to a reference voltage and produce an output;
a digital to analog converter (DAC); and
a digital processing unit (DPU) that is electrically connected to the comparator and the DAC;
wherein the DPU is configured to sample the output of the comparator to infer information associated with a first offset and generate a signal from the inferred information and wherein the DAC is configured to receive the signal and generate a second offset that opposes the first offset.

14. The ADC of claim 11, wherein the means for controlling is configured to power up or power down one or more DACs based on the quality of the input signal.

15. A method of analog to digital conversion, comprising:
determining a quality of an input signal, wherein an analog to digital converter core generates a digital signal representative of the input signal using reference voltages, the digital signal having a number of bits;

controlling the number of bits based on the determined quality; and controlling values of the reference voltages based on the quality of the input signal.

16. The method of claim 15, wherein controlling the number of bits comprises:

generating a precision control signal based on the determined quality.

17. The method of claim 15, wherein controlling the number of bits comprises:

cutting off power to a portion of the analog to digital converter core.

* * * * *

UNITED STATES PATENT AND TRADEMARK OFFICE
CERTIFICATE OF CORRECTION

| | | |
|---|---|---|
| PATENT NO. | : 7,911,365 B2 | Page 1 of 1 |
| APPLICATION NO. | : 12/656055 | |
| DATED | : March 22, 2011 | |
| INVENTOR(S) | : Jun Cao | |

It is certified that error appears in the above-identified patent and that said Letters Patent is hereby corrected as shown below:

Column 1, Line 17, please replace "analog-to-digital" with --analog to digital--

Column 1, Lines 19-20, please replace "analog-to-digital" with --analog to digital--

Column 1, Line 22, please replace "Analog-to-digital" with --Analog to digital--

Column 1, Line 43, please replace "analog-to-digital" with --analog to digital--

Column 1, Line 64, please replace "analog-to-digital" with --analog to digital--

Column 3, Lines 4-5, please replace "analog-to-digital" with --analog to digital--

Column 3, Line 31, please replace "Analog-to-Digital" with --Analog to Digital--

Column 3, Line 35, please replace "analog-to-digital" with --analog to digital--

Column 17, Line 46, please replace "analog-to-digital" with --analog to digital--

Column 18, Line 34, please replace "analog-to-digital" with --analog to digital--

Signed and Sealed this
Fifteenth Day of November, 2011

David J. Kappos
*Director of the United States Patent and Trademark Office*